United States Patent
MacDonald

(10) Patent No.: US 10,302,367 B2
(45) Date of Patent: May 28, 2019

(54) NON-METALLIC VAPOR CHAMBERS

(71) Applicant: Intel Corporation, Santa Clara, CA (US)

(72) Inventor: Mark MacDonald, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 391 days.

(21) Appl. No.: 14/959,010

(22) Filed: Dec. 4, 2015

(65) Prior Publication Data
US 2017/0160017 A1  Jun. 8, 2017

(51) Int. Cl.
*F28D 15/04* (2006.01)
*F28F 21/06* (2006.01)
*H01L 23/427* (2006.01)

(52) U.S. Cl.
CPC .......... *F28D 15/046* (2013.01); *F28F 21/067* (2013.01); *H01L 23/427* (2013.01)

(58) Field of Classification Search
CPC .... F28D 15/02; F28D 15/0241; F28D 15/046; F28D 15/04; F28D 15/0266; F28D 15/0233; F28F 21/067; H01L 23/427
USPC ...................... 165/104.26, 104.21
See application file for complete search history.

(56) References Cited

U.S. PATENT DOCUMENTS

| | | | | |
|---|---|---|---|---|
| 3,613,778 | A * | 10/1971 | Feldman, Jr. .......... | B64G 1/506 165/104.26 |
| 6,158,502 | A * | 12/2000 | Thomas ................... | F28D 15/02 165/104.26 |
| 6,269,866 | B1 * | 8/2001 | Yamamoto .......... | F28D 15/0233 165/104.26 |
| 6,880,626 | B2 * | 4/2005 | Lindemuth ............. | B22F 7/004 165/104.26 |
| 7,234,513 | B2 * | 6/2007 | Wong ................... | F28D 15/0233 165/104.26 |
| 2007/0006993 | A1 * | 1/2007 | Meng ................... | F28D 15/0233 165/104.26 |
| 2007/0056714 | A1 * | 3/2007 | Wong ................... | F28D 15/0233 165/104.26 |
| 2007/0151703 | A1 * | 7/2007 | Touzov .............. | A41D 13/0051 165/45 |

(Continued)

OTHER PUBLICATIONS

Tock—1983—Permeabilities and Water Vapor Transmission Rates for Commercial Polymers.*

*Primary Examiner* — Jianying C Atkisson
*Assistant Examiner* — Jose O Class-Quinones
(74) *Attorney, Agent, or Firm* — Grossman, Tucker, Perreault & Pfleger, PLLC

(57) ABSTRACT

A non-metallic vapor chamber includes a composite wick structure that fills a non-metallic housing. The composite wick structure provides mechanical strength and structural rigidity to the non-metallic vapor chamber. The composite wick structure includes a first hydrophilic wick portion and a second hydrophobic wick portion. A condensed working fluid flows through the first hydrophilic wick portion from a condensation region to a region proximate one or more thermal energy producing devices. A vaporized working fluid flows through the second hydrophobic wick portion from the region proximate one or more thermal energy producing devices to a condensation region where the vaporized working fluid is condensed for reuse.

23 Claims, 3 Drawing Sheets

(56) References Cited

U.S. PATENT DOCUMENTS

| | | | |
|---|---|---|---|
| 2010/0157535 A1* | 6/2010 | Oniki | F28D 15/0233 361/700 |
| 2011/0174464 A1* | 7/2011 | Liu | F28D 15/046 165/104.26 |
| 2011/0198059 A1* | 8/2011 | Gavillet | F28D 15/046 165/104.26 |
| 2013/0213610 A1* | 8/2013 | Wu | F28D 15/0233 165/104.26 |
| 2015/0176917 A1* | 6/2015 | Paschkewitz | B41J 29/377 347/20 |

\* cited by examiner

NON-METALLIC VAPOR CHAMBERS

TECHNICAL FIELD

The present disclosure relates to cooling devices for semiconductors.

BACKGROUND

A vapor chamber is a heat-transfer device that combines principles of both thermal conductivity and phase transition to transfer heat from regions of relatively high thermal activity (e.g., central processing units and graphical processing units) to areas of relatively low thermal activity where the heat collected by the vapor chamber may safely flow from the system (e.g., a fan cooled heat sink). A vapor chamber typically includes a hermetically sealed housing fabricated from a metal or metallic compound, such as copper or copper containing compounds, that demonstrate a very high thermal conductivity. The vapor chamber is charged with a fluid that vaporizes to absorb externally applied heat and condenses to safely reject the heat, generally to a location remote from the heat source. In some instances, a porous wick material such as a sintered metal may be disposed on the internal sidewalls of the vapor chamber. In such implementations, the porous wick material facilitates the transport of condensed fluid within the vapor chamber through capillary action. Conversely, open space within the vapor chamber facilitates the transport of vaporized fluid within the vapor chamber.

Metallic vapor chambers offer fairly high thermal conductivity at a relatively low cost and have found widespread use in desktop and portable computing systems where the presence of large metallic objects does not present objectionable interference with routine operation of the device. However, in smaller devices such as smartphones, handheld, and wearable computing devices, the presence of a rather large metallic object such as a vapor chamber may compromise the performance of the device to an unacceptable degree.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Figure 1A:
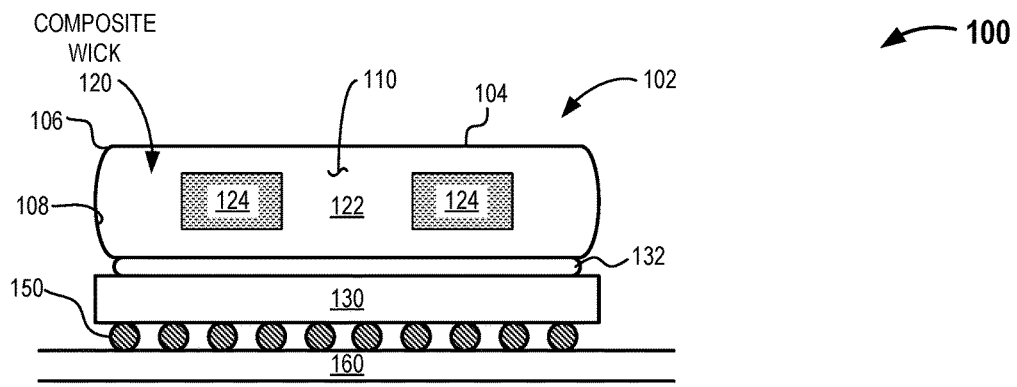
FIG. 1A provides a cross-sectional elevation of the illustrative non-metallic vapor chamber depicted in FIG. 1 along sectional line A-A, in accordance with at least one embodiment of the present disclosure.

Although the following Detailed Description will proceed with reference being made to illustrative embodiments, many alternatives, modifications and variations thereof will be apparent to those skilled in the art.

DETAILED DESCRIPTION

Typically, vapor chambers are fabricated using a material, such as a metal, that provides a high thermal conductivity and facilitates the transfer of thermal energy (i.e., heat) from one portion of an electronic device to another portion of the electronic device where the thermal energy may be dissipated, typically to the ambient environment surrounding the electronic device. While such vapor chambers have found use in desktop and portable computing systems, their acceptance and use in smaller form factor and wireless devices has been compromised due to the adverse impact metallic vapor chambers have on the transmission and receipt of radio frequency communications.

To address the issue of RF interference, a plastic vapor chamber is proposed. The plastic body of such a vapor chamber would be transparent or nearly transparent to RF signals, thereby permitting the use of vapor chamber technology in portable and handheld devices. The plastic body of such a vapor chamber may cover most, or even all, of the back surface of a smartphone or portable computing device to maximize the available heat transfer while not constraining antenna placement within the device. Advantages of such a device include low cost (both bill or material cost and manufacturing cost), light weight, and reasonably high performance. Additionally, such devices may provide cooling sufficient to support the heat generated by current and future high component density processors.

Many plastic vapor chambers employ a five-layer construction (chamber wall—wick—open/void space—wick—chamber wall) similar to that used in traditional copper or aluminum vapor chambers. Plastic vapor chambers have found historical use based on the relatively low cost of materials and the relative ease of fabrication for research and prototype development. The primary obstacle to widespread commercialization of plastic vapor chambers is the poor mechanical strength of plastic vapor chambers which requires the use of thicker outer walls to retain structural rigidity and strength. The increased wall thickness reduces the overall poor thermal conduction through the walls of the chamber.

In the following embodiments, a plastic vapor chamber having a composite wick structure that fills the internal volume of the vapor chamber is provided. Since the composite wick fills the internal volume of the vapor chamber, no internal void space exists within the chamber. Within the vapor chamber variations in the hydrophobicity and hydrophilicity of the composite wick may be used to create vapor and liquid flow regions between the evaporator (hot spot) and condenser (cold spot) regions on the surface of the vapor chamber. The presence of a composite wick structure that is structurally uniform throughout the internal volume of the vapor chamber beneficially provide significant improvements in the mechanical strength and rigidity of the vapor chamber.

The vapor chamber designs disclosed herein advantageously provides for a thin wall vapor chamber that dramatically improves the overall thermal performance of the vapor chamber. The use of a composite wick that fills the internal volume of the chamber, providing structural strength and rigidity to the chamber beneficially permits the use of a thinner plastic chamber wall. A variety of composite wick structures may be employed, including sintered particles, ribs, grooves, pillars, and similar structures providing the necessary degree of overall strength and rigidity to the vapor chamber. Heat dissipation in the plastic vapor chamber may be limited, for example to approximately 5-15 watts—which is sufficient for processor found in many portable or handheld devices.

As used herein, the term "non-metallic" and items referred to using the modifier "non-metallic" includes items having any construction or composition that does not include an substance, compound, or alloy containing one or more transition metals, basic metals, and/or metalloid elements.

A non-metallic vapor chamber is provided. The vapor chamber may include a non-metallic housing defining a closed internal volume and a composite wick structure disposed within the internal volume and filling the internal volume, the composite wick structure providing structural rigidity to the non-metallic housing. The composite wick may include an at least liquid permeable hydrophilic first wick portion; and an at least vapor permeable hydrophobic second wick portion.

A method of transferring heat from a component via a non-metallic vapor chamber is also provided. The method may include flowing, via a composite wick structure, a condensed liquid from a first location to a second location in a non-metallic vapor chamber housing that defines a closed internal volume, the composite wick structure providing a structural support to the non-metallic vapor chamber housing and including: a first wick portion that includes a liquid permeable hydrophilic material; and a second wick portion that includes a vapor permeable hydrophobic material. The method may further include vaporizing, at the second location, at least a portion of the condensed liquid. The method may additionally include flowing, via the second wick portion, at least a portion of the vaporized liquid from the second location to the first location and condensing at least a portion of the vaporized liquid at the first location.

A system for transferring heat from a component via a non-metallic vapor chamber is provided. The system may include a means for internally structurally supporting a non-metallic housing defining a vapor chamber having a closed internal volume, a means for flowing a condensed liquid from a first location to a second location in the non-metallic housing, the means for flowing the condensed liquid comprising at least a first portion of the means for internally structurally supporting the non-metallic housing and a means for flowing a vaporized liquid from the second location to the first location in the non-metallic housing, the means for flowing the vaporized liquid comprising at least a second portion of the means for internally structurally supporting the non-metallic housing.

A method for transferring heat from a component via a non-metallic vapor chamber is provided. The method may include internally structurally supporting a non-metallic housing defining a vapor chamber having a closed internal volume. The method may further include, responsive to a flow of thermal energy from the vapor chamber at a first location on an exterior surface of the vapor chamber, flowing a vaporized liquid, via a hydrophobic material forming a first portion of the internal structural support of the non-metallic vapor chamber, to an internal location in the non-metallic vapor chamber proximate the first location. The method may additionally include, responsive to a flow thermal energy into the vapor chamber at a second location on the exterior surface of the non-metallic vapor chamber, flowing a condensed liquid, via a hydrophilic material forming a remaining portion of the internal structural support of the non-metallic vapor chamber, to an internal location in the non-metallic vapor chamber proximate the second location.

Figure 1:
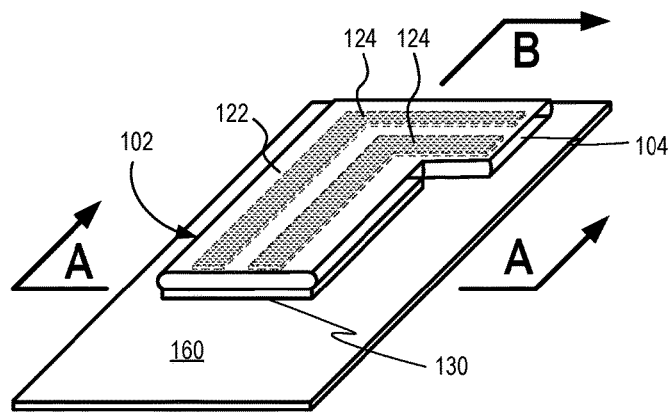
FIG. 1 provides a perspective view of an illustrative non-metallic vapor chamber, in accordance with at least one embodiment of the present disclosure.
Figure 1B:
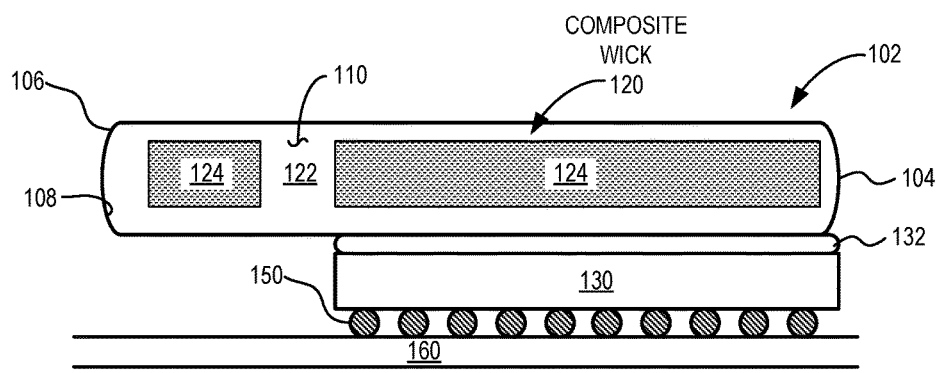
FIG. 1B provides a cross-sectional elevation of the illustrative non-metallic vapor chamber depicted in FIG. 1 along sectional line B-B, in accordance with at least one embodiment of the present disclosure.

FIG. 1 provides a perspective view of an illustrative non-metallic vapor chamber 102, in accordance with at least one embodiment of the present disclosure. FIG. 1A provides a cross-sectional elevation of the illustrative non-metallic vapor chamber 102 depicted in FIG. 1 along sectional line A-A, in accordance with at least one embodiment of the present disclosure. FIG. 1B provides a cross-sectional elevation of the illustrative non-metallic vapor chamber 102 depicted in FIG. 1 along sectional line B-B, in accordance with at least one embodiment of the present disclosure. FIGS. 1 and 1A depict a non-metallic vapor chamber 104 disposed proximate an illustrative heat producing semiconductor device 130. In some implementations, one or more heat transfer mastics 132 or similar substances may be disposed between the vapor chamber 104 and the semiconductor device 130 to improve heat transfer characteristics of the system. The semiconductor device 130 may be disposed on a substrate 160, such as a printed circuit board (PCB). In some implementations, the semiconductor device 130 may be physically and/or electrically conductively coupled to the substrate 160. For example, the semiconductor device 130 may include a ball grid array (BGA) device that is physically and electrically conductively coupled to the substrate 160 via a number of solder balls 150.

The non-metallic vapor chamber 102 may include a non-metallic housing 104 having an inner surface 106 and an outer surface 108. The housing 104 may define a sealed interior volume 110 that may be at least partially filled by a composite wick 120. In embodiments, the composite wick 120 may extend along a longitudinal axis and a lateral axis, occupying the distance between the interior surfaces 106 of the housing 104 such that the composite wick 120 completely fills the interior volume 110 defined by the housing 104 is by. In embodiments, the composite wick 102 may extend at least partially along a longitudinal axis and/or a lateral axis of the housing 104, occupying the distance between at least a portion of the interior surfaces 106 of the housing 104 such that the composite wick 120 "bridges" the distance between the interior surfaces 106 of the housing 104 at one or more locations within the vapor chamber 102.

The housing 104 may be formed or fabricated using one or more current or future developed thermoplastic materials, one or more current or future developed thermosetting materials, or any combination thereof. The housing 104 may include one or more walls or boundary members, each having an interior surface 106 and an exterior surface 108. The one or more walls form a closed housing 104 about an interior volume 110. In some implementations, the one or more walls may form a hermetically sealed, closed, housing 104 about the interior volume 110. Since most vapor chambers are custom fitted to a particular device/electronic enclosure combination, the housing 104 may have any regular or irregular shape, physical configuration, and/or thickness. Beneficially, the use of one or more thermoplastic or thermosetting materials provides the ability to quickly adapt and reconfigure the housing for use with a variety of devices and electronic enclosures. In some implementations, at least a portion of the interior surface 108 of the housing 104 may include, be coated with, or be fabricated using one or more hydrophilic materials. In some implementations, at least a portion of the interior surface 108 of the housing 104 may include, be coated with, or be fabricated using one or more hydrophobic materials.

The greater the thermal conductivity of the housing 104, the greater the ability for the vapor chamber 102 to convey thermal energy from a first location, such as a hotspot formed by a component operating at a relatively high temperature, and the greater the ability for the vapor chamber 102 to reject thermal energy at a second location operating at a relatively low temperature, such as an air cooled portion of the housing 104. Thermal conductivity may be measured in two dimensions, the through-plane thermal conductivity of a substance (i.e., a measure of the ability of the material to transfer heat from one side of the material to the opposite side of the material) and the in-plane thermal conductivity of a material (i.e., the ability of the material to "spread" heat across the material or from end-to-end in the material).

In some implementations, the thermoplastic or thermosetting materials used to form all or a portion of the housing 104 may have one or more additives, compounds, or similar materials that enhance, increase, or improve the through-plane and/or in-plane thermal conductivity of the material. Such materials that enhance the through-plane and/or in-plane thermal conductivity of a thermoplastic or thermosetting material may include, but are not limited to: carbon or graphite fibers and ceramic structures. The of a thermoplastic material used to fabricate all or a portion of the housing 104 may have a through-plane conductivity and/or in-plane thermal conductivity of about 1.0 watts per meter per Kelvin (W/m·K) or less; about 0.75 W/m·K or less; about 0.50 W/m·K or less; or about 0.25 W/m·K or less.

In some implementations, the housing 104 may include one or more thermoplastic materials and may be formed by any current or future molding technology including, but not limited to: injection molding, blow molding, extrusion, or rotational molding. In some implementations, one or more thermoplastic materials forming the housing 104 may be selected based at least in part on the water vapor transmission rate (WVTR). For example, the thermoplastic material used to fabricate the housing 104 may have a WVTR of less than about 5 grams per mil per 100 square inches over a 24 hour period (g-mil/100 in$^2$/24 hr); less than about 3 g-mil/100 in$^2$/24 hr; less than about 2 g-mil/100 in$^2$/24 hr; less than about 1 g-mil/100 in$^2$/24 hr; or less than about 0.5 g-mil/100 in$^2$/24 hr. Example, non-limiting, thermoplastic materials include high-density polyethylene (HDPE), ultra-high molecular weight polyethylene (UHMWPE), and polypropylene (PP). In some implementations, the housing 104 may be formed by joining or affixing multiple thermoplastic structures by thermal, chemical, or mechanical welding techniques. In at least one example, the housing 104 may include a multi-piece HDPE assembly that is hermetically sealed about a composite wick structure using one or more thermal welding techniques.

Thermal energy released by the component 130 passes through a portion of the wall of the vapor chamber 102. One or more working fluids disposed within the vapor chamber 102 absorb the thermal energy, eventually absorbing sufficient energy that at least a portion of the one or more working fluids vaporize. The vaporized working fluid passes through the second, hydrophobic, portion 124 of the composite wick 120 and travels along the second portion 124 to a location or region within the vapor chamber 102 where the temperature is sufficiently low that at least a portion of the vaporized working fluid condenses. Capillary action may then draw the condensed working fluid through the first, hydrophilic, portion 122 of the composite wick 120 back to the higher temperature area of the vapor chamber 102 where at least a portion of the working fluid once again vaporizes. Example working fluids used within the vapor chamber 102 may include, but are not limited to, water, ammonia, methanol, acetone, or combinations thereof.

The composite wick 120 fills the interior volume 110 of the vapor chamber 102. By filling the interior volume 110 of the vapor chamber 102, the composite wick 120 advantageously performs multiple functions. First, the composite wick 120 beneficially provides structural strength and rigidity to the non-metallic housing 104 of the vapor chamber 102. Second, the composite wick 120 beneficially provides defined condensed working fluid and vaporized working fluid flow paths throughout the vapor chamber 102, improving the performance and/or efficiency of the vapor chamber 102. The composite wick 120 includes a hydrophilic first portion 122 that may be used as a condensed working fluid transport media within the vapor chamber 102 and a hydrophobic second portion 124 that may be as a vaporized working fluid transport media within the vapor chamber 102.

It should be noted that hydrophilic and hydrophobic are used as distinguishing terms and should not be construed to limit the working fluid used in the vapor chamber 102 to water and/or water-based solutions. Rather, the term hydrophilic should be construed as including any material that exerts an attraction to the working fluid in the vapor chamber 102 (e.g., for an acetone-based working fluid, "hydrophilic" would be construed as a material that attracts acetone). Similarly, the term hydrophobic should be construed as including any material that exerts a repulsion to the working fluid used in the vapor chamber 102 (e.g., for a methanol-based working fluid, "hydrophobic" would be construed as a material that repulses methanol).

The composite wick 120 provides structural strength and rigidity to the vapor chamber 102, thereby permitting the use of thinner, non-metallic, walls to form the housing 104. The use of thinner walls in forming the housing 104 beneficially improves the thermal performance of the vapor chamber 102. The composite wick 120 includes at least a first portion 122 that includes at least one hydrophilic material. The composite wick 120 also includes at least a second portion 124 that includes at least one hydrophobic material. The first hydrophilic portion 122 and the second hydrophobic portion 124 synergistically provide pathways for the movement of condensed working fluid and vaporized working fluid (respectively) through the vapor chamber 102. Advantageously, the patterning of the hydrophilic first portion 122 and the hydrophobic second portion 124 of the composite wick 120 permits a designer to direct the flow of working fluid, both liquid and vaporized, throughout the vapor chamber 102. For example, a serpentine vaporized working fluid flow path may be created using appropriate patterning of the hydrophobic second portion 124 of the composite wick 120.

The first portion 122 of the composite wick 120 includes at least one hydrophilic material. In embodiments, the first portion 122 of the composite wick 120 may be fabricated throughout using the one or more hydrophilic materials. In other embodiments, the first portion 122 of the composite wick 120 may be fabricated using a hydrophilic material, coating, or applique disposed on one or more substrates. The first portion 122 of the composite wick 120 facilitates the transport of condensed working fluid through the vapor chamber 102. In embodiments, capillary action may draw the condensed working fluid through the first portion 122 of the composite wick 120. To facilitate the passage of the condensed working fluid via capillary action, the first portion 122 of the composite wick 120 may include physical structures such as sintered particles, micro-channels, micro-grooves, ribs, grooves, pillars, or other closely spaced structures.

The second portion 124 of the composite wick 120 includes at least one hydrophobic material. In embodiments, the second portion 124 of the composite wick 120 may be fabricated throughout using the one or more hydrophobic materials. In other embodiments, the second portion 124 of the composite wick 120 may be fabricated using a hydrophobic material, coating, or applique disposed on one or more substrates. The second portion 124 of the composite wick 120 facilitates the transport of vaporized working fluid through the vapor chamber 102. To facilitate the passage of the vaporized working fluid, the second portion 124 of the composite wick 120 may include vapor flow channels formed between physical structures such as sintered particles, micro-channels, micro-grooves, ribs, grooves, pillars, or other closely spaced structures.

Figure 2:
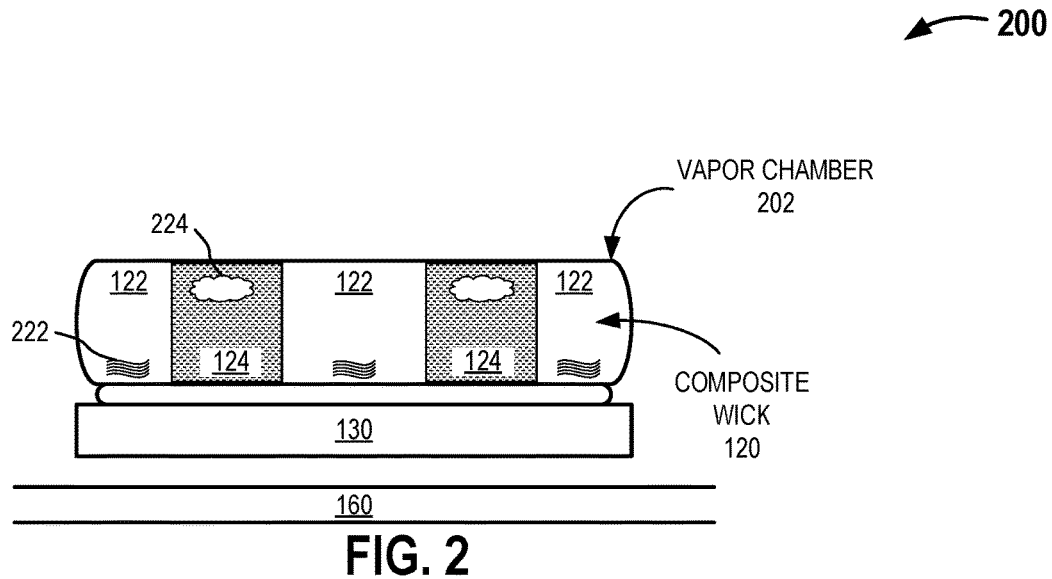
FIG. 2 provides a cross-sectional elevation of another illustrative non-metallic vapor chamber, in accordance with at least one embodiment of the present disclosure.

FIG. 2 provides a cross-sectional elevation of another illustrative non-metallic vapor chamber 202, in accordance with at least one embodiment of the present disclosure. As depicted in FIG. 2, the hydrophilic first portion 122 of the composite wick 120 extends the full height of the vapor chamber 102. Similarly, the hydrophobic second portion 124 of the composite wick 120 extends the full height of the vapor chamber 102. Also as depicted in FIG. 2, when operating the condensed working fluid 222 flows through the hydrophilic first portion 122 of the composite wick 120 and the vaporized working fluid 224 flows through the hydrophobic second portion 124 of the composite wick 120.

Figure 3:
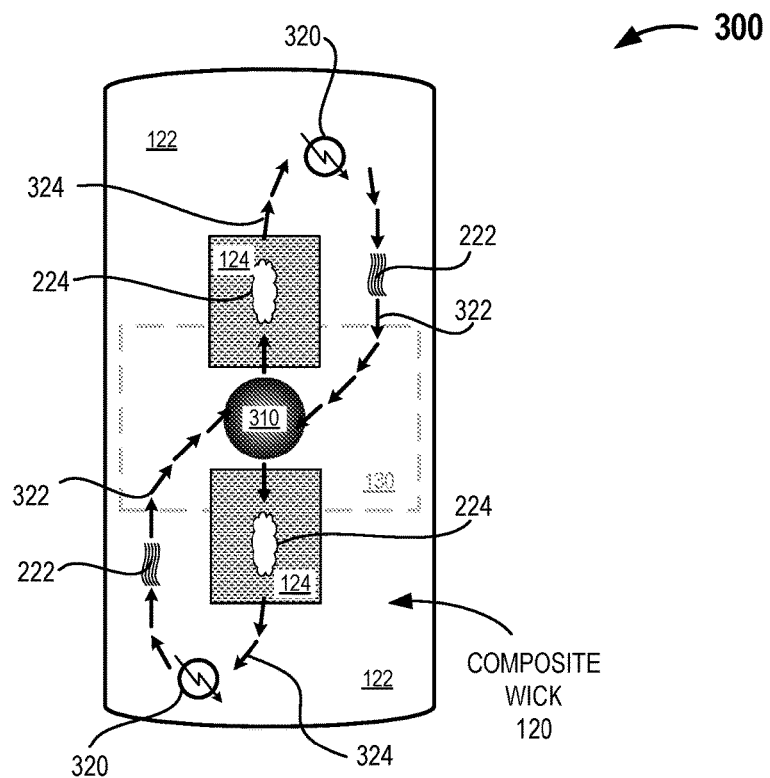
FIG. 3 provides cross-sectional plan of another illustrative non-metallic vapor chamber depicting illustrative vaporized working fluid and condensed working fluid flow paths through the vapor chamber, in accordance with at least one embodiment of the present disclosure.

FIG. 3 provides cross-sectional plan of another illustrative non-metallic vapor chamber 300 depicting an illustrative condensed working fluid flow path 322 and an illustrative vaporized working fluid flow path 324 through the vapor chamber 300, in accordance with at least one embodiment of the present disclosure. As depicted in FIG. 3, a heat producing component 130 may be disposed centrally beneath the vapor chamber 300. Thermal energy released by the component 130 concentrates to form a hot spot 310 (i.e., a region at or above a temperature at which the working fluid begins to vaporize or boil) within the vapor chamber 300. The concentration of thermal energy at the hot spot 310 vaporizes at least a portion of the working fluid 224 in the vapor chamber 300.

The vaporized working fluid 224 flows 324 through the hydrophobic second portion 124 of the composite wick 120 to a condensation region 320 (i.e., a region at or below a temperature at which the working fluid begins to condense). As the vaporized working fluid 224 flows 324 through the condensation region 320, a portion of the vaporized working fluid condenses to provide condensed working fluid 222. The condensed working fluid 222 flows 322 via capillary action through the hydrophilic first portion 122 of the composite wick 120 and returns to the hot spot 310 where the cycle is repeated.

Although not depicted in FIG. 3 for clarity, in some implementations, one or more passive cooling devices, such as one or more cooling fins or similar extended surface area heat exchangers, may be thermally coupled to the housing 104 to improve the cooling efficiency or to increase the condensation region 320 of the vapor chamber 300. In some implementations, such passive cooling devices may be formed integrally with at least a portion of the housing 104. In some implementations, such passive cooling devices may include one or more separate devices thermally bonded to the housing 104 or are thermally coupled to the vapor chamber 300.

Although not depicted in FIG. 3 for clarity, in some implementations, one or more active cooling devices, such as one or more fans, piezoelectric jet coolers, and similar, may provide a flow of air over at least a portion of the housing 104 and/or one or more extended surface passive cooling devices thermally coupled to the housing 104 or are thermally coupled to the vapor chamber 300.

Figure 4:
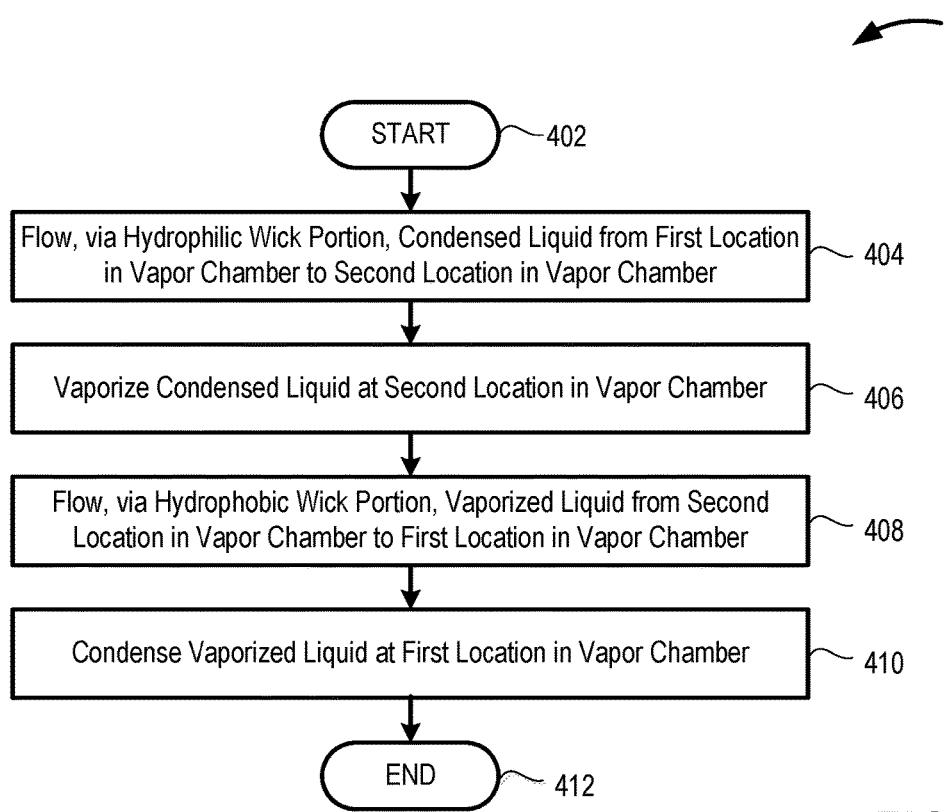
FIG. 4 provides a high-level flow diagram of an illustrative method for cooling a device using a non-metallic vapor chamber such as those depicted in FIGS. 1, 2, and 3, in accordance with at least one embodiment of the present disclosure.

FIG. 4 provides a high-level flow diagram of an illustrative method 400 for cooling a component 130 using a non-metallic vapor chamber 102, 202, 300 such as those depicted in FIGS. 1, 2, and 3 (respectively), in accordance with at least one embodiment of the present disclosure. The presence of a composite wick 120 that fills the interior volume 110 of the vapor chamber 102, 202, 300 provides adequate mechanical strength and structural rigidity such that the housing 104 may be made sufficiently thin to permit acceptable heat flux through the housing 104. The use of non-metallic materials in fabricating the housing 104 and the composite wick 120 minimizes RF interference between the vapor chamber 102, 202, 300 and one or more antennas typically found in smartphones and other wireless portable computing devices. The light weight and ease of manufacture of even complex shapes provided by a non-metallic vapor chamber 102, 202, 300 provides distinct advantages over traditional copper and aluminum vapor chambers. The method 400 commences at 402.

At 404, a hydrophilic first portion 122 of a composite wick 120 facilitates the flow 322 of a condensed working fluid 222 from a first location in a non-metallic vapor chamber 102, 202, 300, such as a condensation region 320 that is at or below the condensation temperature of the working fluid to a second location in a non-metallic vapor chamber 102, 202, 300, such as a hot spot 310 that is above the vaporization temperature of the working fluid. The composite wick 120 represents a structural portion of the non-metallic vapor chamber 102, 202, 300 that provides both mechanical strength and structural rigidity to the non-metallic vapor chamber 102, 202, 300.

In at least some implementations, the condensed working fluid 222 flows via capillary action through the hydrophilic first portion 122 of the composite wick 120. In embodiments, the physical structure of the composite wick 120 may facilitate the flow of the condensed working fluid 222 through the hydrophilic first portion 122.

At 406, at least a portion of the condensed working fluid 222 may be vaporized at the hot spot 310 (i.e., the second location) in a non-metallic vapor chamber 102, 202, 300 to provide a vaporized working fluid 224.

At 408, a hydrophobic second portion 124 of the composite wick 120 facilitates the flow 324 of the vaporized working fluid 224 from the second location in the non-metallic vapor chamber 102, 202, 300 to the first location in the non-metallic vapor chamber 102, 202, 300. In some implementations, the vaporized working fluid 224 may flow via convection from the relatively high temperature hot spot 310 (i.e., the second location) to the relatively low temperature condensation region 320 (i.e., the first location).

At 410, at least a portion of the vaporized working fluid 224 may be condensed at the condensation region 320 (i.e., the first location) in the non-metallic vapor chamber 102, 202, 300 to provide the condensed working fluid 222. The method 400 concludes at 412.

Figure 5:
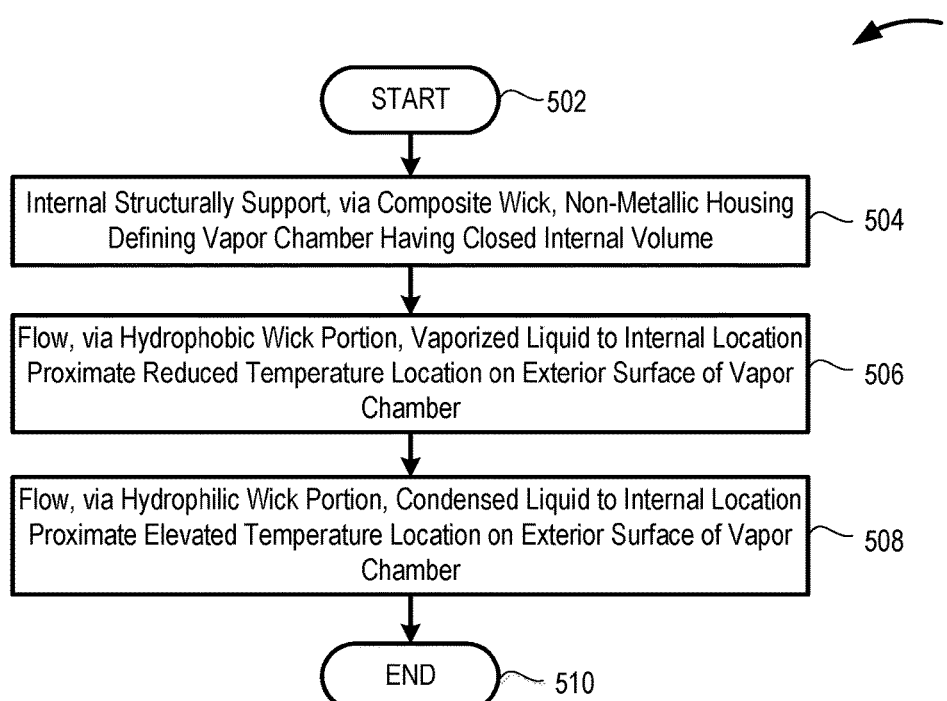
FIG. 5 provides a high-level flow diagram of another illustrative method for cooling a device using a non-metallic vapor chamber such as those depicted in FIGS. 1, 2, and 3, in accordance with at least one embodiment of the present disclosure.

FIG. 5 provides a high-level flow diagram of another illustrative method 500 for cooling a component 130 using a non-metallic vapor chamber 102, 202, 300 such as those depicted in FIGS. 1, 2, and 3 (respectively), in accordance with at least one embodiment of the present disclosure. The method commences at 502.

At 504, a composite wick 120 that includes a hydrophilic first wick portion 122 and a hydrophobic second wick portion 124 may be disposed within a non-metallic housing 104 to provide the non-metallic vapor chamber 102, 202, 300. Since the composite wick 120 provides structural support to the housing 104, the walls of the housing 104 may be relatively thin, beneficially improving the heat flux through the housing 104 to the working fluid in the vapor chamber 102, 202, 300. The composite wick 120 fills the internal volume 110 of the housing 140 and provides mechanical strength and structural rigidity to the vapor chamber 102, 202, 300. The vapor chamber 102, 202, 300 may have any proportion of hydrophilic first wick portion 122 to hydrophobic second wick portion 124. For example, the relative percentages of hydrophilic first wick portion 122 to hydrophobic second wick portion 124 may be: about 20% or more hydrophilic first wick portion 122 to about 80% or less hydrophobic second wick portion 124; about 40% or more hydrophilic first wick portion 122 to about 60% or less hydrophobic second wick portion 124; about 60% or more hydrophilic first wick portion 122 to about 40% or less hydrophobic second wick portion 124; or about 80% or more hydrophilic first wick portion 122 to about 20% or less hydrophobic second wick portion 124.

At 506, responsive to a flow of thermal energy from the interior volume 110 of the vapor chamber 102, 202, 300 at a first location on the exterior surface 106 of the vapor chamber 102, 202, 300 (e.g., a condensation region 320), flowing 324 a vaporized working fluid 224 to a location on the internal surface 108 of the vapor chamber 102, 202, 300 that is proximate the first location. The vaporized working fluid 224 will condense as the temperature of the vaporized working fluid 224 drops within the vapor chamber 102, 202, 300.

At 508, responsive to a flow of thermal energy to the interior volume 110 of the vapor chamber 102, 202, 300 at a second location on the exterior surface 106 of the vapor chamber 102, 202, 300 (e.g., a vaporization region or hot spot 320), flowing 322 a condensed working fluid 222 to a location on the internal surface 108 of the vapor chamber 102, 202, 300 that is proximate the first location. The condensed working fluid 222 will vaporize as the temperature of the condensed working fluid 222 increases within the vapor chamber 102, 202, 300. The method 500 concludes at 512.

The following examples pertain to further embodiments. The following examples of the present disclosure may comprise subject material such as a device, a method, at least one machine-readable medium for storing instructions that when executed cause a machine to perform acts based on the method, means for performing acts based on the method and/or a system for binding a trusted input session to a trusted output session to prevent the reuse of encrypted data obtained from prior trusted output sessions.

According to example 1, there is provided a non-metallic vapor chamber. The non-metallic vapor chamber may include a non-metallic housing defining a closed internal volume and a composite wick structure disposed within the internal volume and filling the internal volume, the composite wick structure providing structural rigidity to the non-metallic housing. The composite wick structure may include an at least liquid permeable hydrophilic first wick portion and an at least vapor permeable hydrophobic second wick portion.

Example 2 may include elements of example 1 where the non-metallic housing may include at least a first location and a second location, the hydrophilic first wick portion provides a continuous path from the first location to the second location of the non-metallic housing, and the hydrophobic second wick portion provides a continuous path from the first location to the second location of the non-metallic housing.

Example 3 may include elements of example 1 where the housing may include a sealed housing.

Example 4 may include elements of example 1 where the housing may include a hermetically sealed housing.

Example 5 may include elements of example 1 where the non-metallic housing may include a thermoplastic material.

Example 6 may include elements of example 5 where the thermoplastic material may include a thermoplastic material having a water vapor transmission rate (WVTR) of less than about 2 g-mil/100 in$^2$ per 24 hours.

Example 7 may include elements of example 1 where the non-metallic housing may include a thermoplastic material including at least one of: high density polyethylene, polypropylene, or ultra-high molecular weight polyethylene.

Example 8 may include elements of example 1 where the non-metallic housing may include a material transparent to radio frequency (RF) signals.

Example 9 may include elements of example 1 where the first wick portion may include a structure that includes at least one of: a sintered particle material, a ribbed material, a grooved material, or a pillared material.

Example 10 may include elements of example 9 where the first wick portion may include a structure at least partially coated with at least one hydrophilic material.

Example 11 may include elements of example 1 where the second wick portion may include a structure that includes at least one of: a sintered particle material, a ribbed material, a grooved material, or a pillared material.

Example 12 may include elements of example 11 where the second wick portion may include a structure at least partially coated with at least one hydrophobic material.

Example 13 may include elements of example 1 where the vapor permeable hydrophobic second wick portion may transport a vaporized fluid from a first location within the internal volume of vapor chamber to a second location within the internal volume of the vapor chamber, and the liquid permeable hydrophilic first wick portion may transport a condensed fluid from the second location in the internal volume of the vapor chamber to the first location in the internal volume of the vapor chamber.

According to example 14, there is provided a method of transferring heat from a component via a non-metallic vapor chamber. The method may include flowing, via a composite wick structure, a condensed liquid from a first location to a second location in a non-metallic vapor chamber housing that defines a closed internal volume, the composite wick structure providing a structural support to the non-metallic vapor chamber housing and including: a first wick portion that includes a liquid permeable hydrophilic material; and a second wick portion that includes a vapor permeable hydrophobic material. The method may further include vaporizing, at the second location, at least a portion of the condensed liquid, flowing, via the second wick portion, at least a portion of the vaporized liquid from the second location to the first location, and condensing at least a portion of the vaporized liquid at the first location.

Example 15 may include elements of example 14 where flowing, via a composite wick structure, a condensed liquid from a first location to a second location in a non-metallic vapor chamber housing, the composite wick structure providing a structural support to the non-metallic vapor chamber housing may include flowing, via the composite wick structure, the condensed liquid from the first location to the second location in the non-metallic vapor chamber housing, the composite wick structure filling the closed internal volume of the non-metallic vapor chamber housing.

Example 16 may include elements of example 14 where flowing a condensed liquid from a first location to a second location in a non-metallic housing may include flowing, via the first wick portion, the condensed liquid from the first location to the second location, the first wick portion including at least one of: a sintered particle material, a ribbed material, a grooved material, or a pillared material.

Example 17 may include elements of example 14 where flowing a condensed liquid from a first location to a second location in a non-metallic housing may include flowing, via the first wick portion, the condensed liquid from the first location to the second location, the first wick portion including a substrate at least partially covered by a layer of hydrophilic material.

Example 18 may include elements of example 14 where flowing a condensed liquid from a first location to a second location in a non-metallic housing may include flowing, via the first wick portion, a condensed liquid from the first location to the second location in a non-metallic housing comprising a hermetically sealed, non-metallic housing.

Example 19 may include elements of example 14 and may additionally include structurally supporting, by the composite wick structure, at least a portion of the non-metallic housing.

Example 20 may include elements of example 14 where flowing at least a portion of the vaporized liquid from the second location to the first location may include flowing, via the second wick portion, the vaporized liquid from the second location to the first location, the second wick portion including at least one of: a sintered particle material, a ribbed material, a grooved material, or a pillared material.

Example 21 may include elements of example 14 where flowing at least a portion of the vaporized liquid from the second location to the first location may include flowing, via the second wick portion, the vaporized liquid from the first location to the second location, the second wick portion including a substrate at least partially covered by a layer of hydrophobic material.

According to example 22, there is provided a system for transferring heat from a component via a non-metallic vapor chamber. The system may include a means for internally structurally supporting a non-metallic housing defining a vapor chamber having a closed internal volume and a means for flowing a condensed liquid from a first location to a second location in the non-metallic housing, the means for flowing the condensed liquid comprising at least a first portion of the means for internally structurally supporting the non-metallic housing. The system may further include a means for flowing a vaporized liquid from the second location to the first location in the non-metallic housing, the means for flowing the vaporized liquid comprising at least a second portion of the means for internally structurally supporting the non-metallic housing.

Example 23 may include elements of example 22 where the means for internally structurally supporting a non-metallic housing defining a vapor chamber having a closed internal volume may include a means for continuously internally structurally supporting a non-metallic housing defining a vapor chamber having a closed internal volume.

Example 24 may include elements of example 23 where the means for flowing a condensed liquid from a first location to a second location in a non-metallic may include a hydrophilic material means for flowing the condensed liquid from the first location to the second location in the non-metallic housing.

Example 25 may include elements of example 24 where the means for flowing a vaporized liquid from the second location to the first location in the non-metallic housing may include a hydrophobic material means for preferentially flowing the vaporized liquid from the second location to the first location in the non-metallic housing.

According to example 26, there is provided a method for transferring heat from a component via a non-metallic vapor chamber. The method may include internally structurally supporting a non-metallic housing defining a vapor chamber having a closed internal volume. The method may further include, responsive to a flow of thermal energy from the vapor chamber at a first location on an exterior surface of the vapor chamber, flowing a vaporized liquid, via a hydrophobic material forming a first portion of the internal structural support of the non-metallic vapor chamber, to an internal location in the non-metallic vapor chamber proximate the first location. The method may additionally include, responsive to a flow thermal energy into the vapor chamber at a second location on the exterior surface of the non-metallic vapor chamber, flowing a condensed liquid, via a hydrophilic material forming a remaining portion of the internal structural support of the non-metallic vapor chamber, to an internal location in the non-metallic vapor chamber proximate the second location.

Example 27 may include elements of example 26 where internally structurally supporting a non-metallic housing defining a vapor chamber having a closed internal volume may include internally structurally supporting, via a composite wick structure, the non-metallic housing defining the vapor chamber having the closed internal volume, the composite wick structure including the hydrophobic first portion and the hydrophilic second portion.

Example 28 may include elements of example 26 where a vaporized liquid via a hydrophobic material forming a first portion of the internal structural support of the non-metallic vapor chamber may include flowing the vaporized liquid via the hydrophobic first portion of the internal structural support, the hydrophobic first portion including at least one of: a sintered particle hydrophobic material, a ribbed hydrophobic material, a grooved hydrophobic material, or a pillared hydrophobic material.

Example 29 may include elements of example 26 where flowing a vaporized liquid via a hydrophobic material forming a first portion of the internal structural support of the non-metallic vapor chamber may include flowing the vaporized liquid via the hydrophobic first portion of the internal structural support, the hydrophobic first portion including a hydrophobic material disposed on a substrate.

Example 30 may include elements of example 26 where flowing a vaporized liquid via a hydrophobic material forming a first portion of the internal structural support of the non-metallic vapor chamber may include flowing a vaporized liquid via a hydrophobic material forming a first portion of the internal structural support of a hermetically sealed vapor chamber.

Example 31 may include elements of example 26 where flowing a condensed liquid via a hydrophilic material forming a remaining portion of the internal structural support of the non-metallic vapor chamber may include flowing a condensed liquid via the hydrophilic material forming the remaining portion of the internal structural support, the hydrophilic second portion including at least one of: a sintered particle material, a ribbed material, a grooved material, or a pillared material.

Example 32 may include elements of example 26 where flowing a condensed liquid via a hydrophilic material forming a remaining portion of the internal structural support of the non-metallic vapor chamber may include flowing the condensed liquid via the hydrophilic remaining portion of the internal structural support, the hydrophilic remaining portion including a hydrophilic material disposed on a substrate.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed:

1. A non-metallic vapor chamber, comprising:
a non-metallic housing defining a closed internal volume, wherein the non-metallic housing comprises at least one of a thermoplastic material or a thermosetting material and has a thermal conductivity of approximately 1 Watt per meter per Kelvin or less;
a composite wick structure disposed within the internal volume and filling the internal volume, the composite wick structure providing structural rigidity to the non-metallic housing and comprising:
a liquid permeable hydrophilic first wick portion; and
a vapor permeable hydrophobic second wick portion.

2. The non-metallic vapor chamber of claim 1:
wherein the non-metallic housing comprises at least a first location and a second location;
wherein the hydrophilic first wick portion provides a continuous path from the first location to the second location of the non-metallic housing; and
wherein the hydrophobic second wick portion provides a continuous path from the first location to the second location of the non-metallic housing.

3. The non-metallic vapor chamber of claim 1 wherein the housing comprises a sealed housing.

4. The non-metallic vapor chamber of claim 1 wherein the housing comprises a hermetically sealed housing.

5. The non-metallic vapor chamber of claim 1, wherein the thermoplastic material or the thermosetting material comprises a thermoplastic material having a water vapor transmission rate (WVTR) of less than about 2 g-mil/100 in$^2$ per 24 hours.

6. The non-metallic vapor chamber of claim 1 wherein the non-metallic housing comprises a thermoplastic material including at least one of: high density polyethylene, polypropylene, or ultra-high molecular weight polyethylene.

7. The non-metallic vapor chamber of claim 1 wherein the non-metallic housing comprises a material transparent to radio frequency (RF) signals.

8. The non-metallic vapor chamber of claim 1 wherein the first wick portion comprises a structure that includes at least one of: a sintered particle material, a ribbed material, a grooved material, or a pillared material.

9. The non-metallic vapor chamber of claim 8 wherein the first wick portion comprises a structure at least partially coated with at least one hydrophilic material.

10. The non-metallic vapor chamber of claim 1 wherein the second wick portion comprises a structure that includes at least one of: a sintered particle material, a ribbed material, a grooved material, or a pillared material.

11. The non-metallic vapor chamber of claim 10 wherein the second wick portion comprises a structure at least partially coated with at least one hydrophobic material.

12. The non-metallic vapor chamber of claim 1, the vapor permeable hydrophobic second wick portion to transport a vaporized fluid from a first location within the internal volume of the vapor chamber to a second location within the internal volume of the vapor chamber; and
the liquid permeable hydrophilic first wick portion to transport a condensed fluid from the second location in the internal volume of the vapor chamber to the first location in the internal volume of the vapor chamber.

13. A method of transferring heat from a component via a non-metallic vapor chamber, the method comprising:
flowing, via a composite wick structure, a condensed liquid from a first location to a second location in a non-metallic vapor chamber housing that defines a closed internal volume, that comprises at least one of a thermoplastic material or a thermosetting material, and that has a thermal conductivity of approximately 1 Watt per meter per Kelvin or less, the composite wick structure filling the closed internal volume, providing a structural support to the non-metallic vapor chamber housing, and including:
a first wick portion that includes a liquid permeable hydrophilic material; and
a second wick portion that includes a vapor permeable hydrophobic material;
vaporizing, at the second location, at least a portion of the condensed liquid;
flowing, via the second wick portion, at least a portion of the vaporized liquid from the second location to the first location; and
condensing at least a portion of the vaporized liquid at the first location.

14. The method of claim 13 wherein flowing, via a composite wick structure, a condensed liquid from a first location to a second location in a non-metallic vapor chamber housing, the composite wick structure providing a structural support to the non-metallic vapor chamber housing comprises:
flowing, via the composite wick structure, the condensed liquid from the first location to the second location in the non-metallic vapor chamber housing, the composite wick structure filling the closed internal volume of the non-metallic vapor chamber housing.

15. The method of claim 13 wherein flowing a condensed liquid from a first location to a second location in a non-metallic housing comprises:
flowing, via the first wick portion, the condensed liquid from the first location to the second location, the first wick portion including at least one of: a sintered particle material, a ribbed material, a grooved material, or a pillared material.

16. The method of claim 13 wherein flowing a condensed liquid from a first location to a second location in a non-metallic housing comprises:
flowing, via the first wick portion, the condensed liquid from the first location to the second location, the first wick portion including a substrate at least partially covered by a layer of hydrophilic material.

17. The method of claim 13 wherein flowing a condensed liquid from a first location to a second location in a non-metallic housing comprises:
flowing, via the first wick portion, the condensed liquid from the first location to the second location in the non-metallic housing comprising a hermetically sealed, non-metallic, housing.

18. The method of claim 13 wherein flowing at least a portion of the vaporized liquid from the second location to the first location comprises:
flowing, via the second wick portion, the vaporized liquid from the second location to the first location, the second wick portion including at least one of: a sintered particle material, a ribbed material, a grooved material, or a pillared material.

19. The method of claim 13 wherein flowing at least a portion of the vaporized liquid from the second location to the first location comprises:
flowing, via the second wick portion, the vaporized liquid from the first location to the second location, the second wick portion including a substrate at least partially covered by a layer of hydrophobic material.

20. A system for transferring heat from a component via a non-metallic vapor chamber, the system comprising:
a non-metallic housing defining a vapor chamber having a closed internal volume, the non-metallic housing comprising at least one of a thermoplastic material or a thermosetting material and having a thermal conductivity of approximately 1 Watt per meter per Kelvin or less;
a wicking means for internally structurally supporting the non-metallic housing, the wicking means filling the closed internal volume of the defined vapor chamber and comprising:
a means for flowing a condensed liquid from a first location to a second location in the non-metallic housing; and
a means for flowing a vaporized liquid from the second location to the first location in the non-metallic housing.

21. The system of claim 20 wherein the wicking means for internally structurally supporting the non-metallic housing defining the vapor chamber comprises:
a means for continuously internally structurally supporting the non-metallic housing defining the vapor chamber.

22. The system of claim 21 wherein the means for flowing a condensed liquid from a first location to a second location in a non-metallic housing comprises:
a hydrophilic material means for flowing the condensed liquid from the first location to the second location in the non-metallic housing.

23. The system of claim 22 wherein the means for flowing a vaporized liquid from the second location to the first location in the non-metallic housing comprises:
a hydrophobic material means for flowing the vaporized liquid from the second location to the first location in the non-metallic housing.

* * * * *